United States Patent
Imai et al.

(10) Patent No.: US 7,433,259 B2
(45) Date of Patent: Oct. 7, 2008

(54) SEMICONDUCTOR MEMORY DEVICE HAVING LAYERED BIT LINE STRUCTURE

(75) Inventors: Kimimasa Imai, Kawasaki (JP); Tomoaki Yabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/507,600

(22) Filed: Aug. 22, 2006

(65) Prior Publication Data

US 2007/0047368 A1    Mar. 1, 2007

(30) Foreign Application Priority Data

Aug. 23, 2005   (JP)   ............... 2005-241259

(51) Int. Cl.
    *G11C 8/00* (2006.01)
(52) U.S. Cl. .................. 365/230.03; 365/205
(58) Field of Classification Search ............ 365/230.03, 365/205
    See application file for complete search history.

(56) References Cited

U.S. PATENT DOCUMENTS 5,815,428 A    9/1998   Tsuruda et al.
6,522,565 B2 *  2/2003   Shimazaki et al. ............ 365/63
6,657,880 B1   12/2003   Callahan
2007/0047368 A1  3/2007  Imai et al.

FOREIGN PATENT DOCUMENTS

JP    8-236714    9/1996
JP    2002-100187  4/2002

OTHER PUBLICATIONS

U.S. Appl. No. 11/952,441, filed Dec. 7, 2007, Fukano et al.

* cited by examiner

*Primary Examiner*—Michael T Tran
(74) *Attorney, Agent, or Firm*—Oblon, Spivak, McClelland, Maier & Neustadt, P.C.

(57) ABSTRACT

A basic unit block has a plurality of memory cells, a local bit line pair connected to the plurality of memory cells, and a bit line precharge circuit and a transfer gate switch circuit which are connected to the local bit line pair. The local bit line pairs in a plurality of basic unit blocks are connected to a global bit line pair via the transfer gate switch circuit. The global bit line pair constitutes a layered bit line structure together with the local bit line pair. The global bit line pair is laid out to extend in the same direction and is twisted once or more in this extending direction.

13 Claims, 5 Drawing Sheets

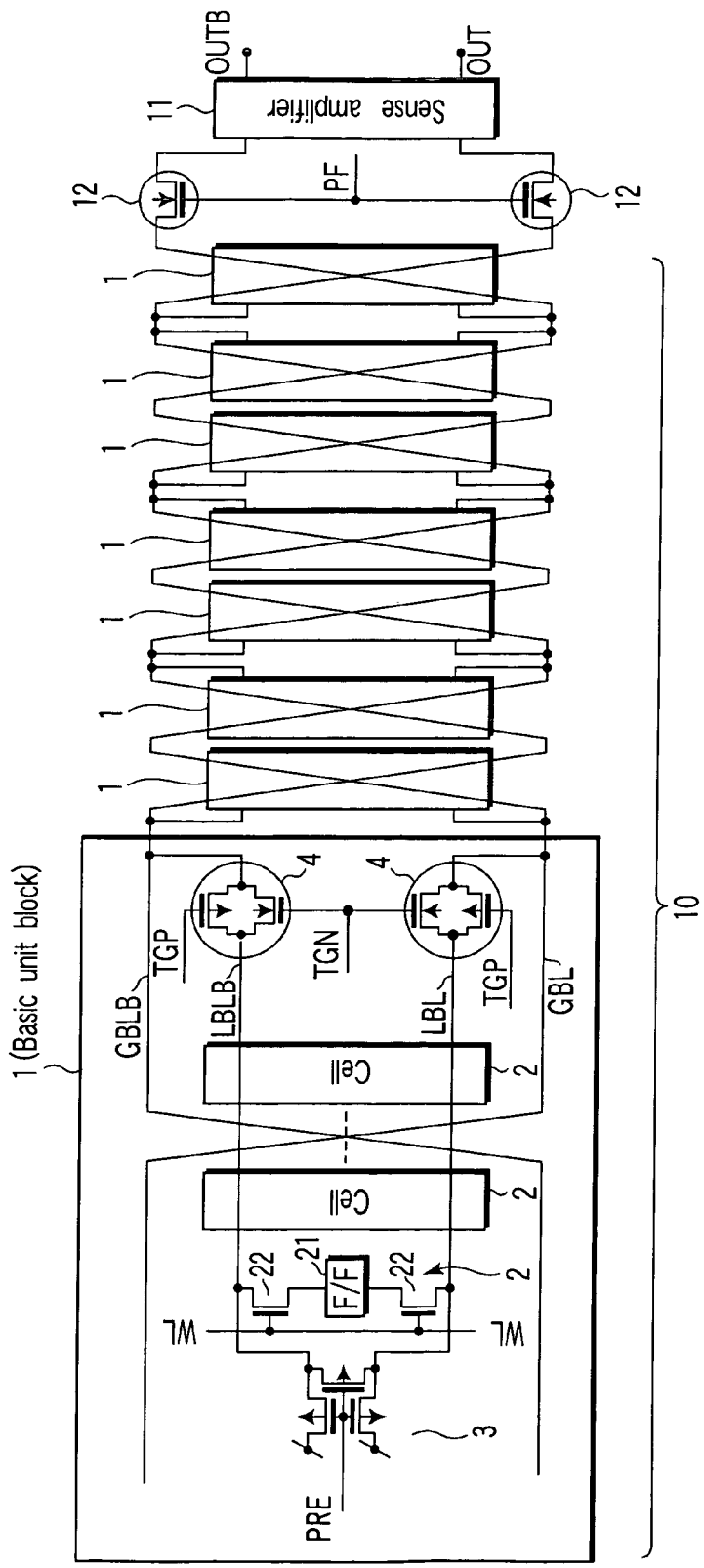
F I G. 1

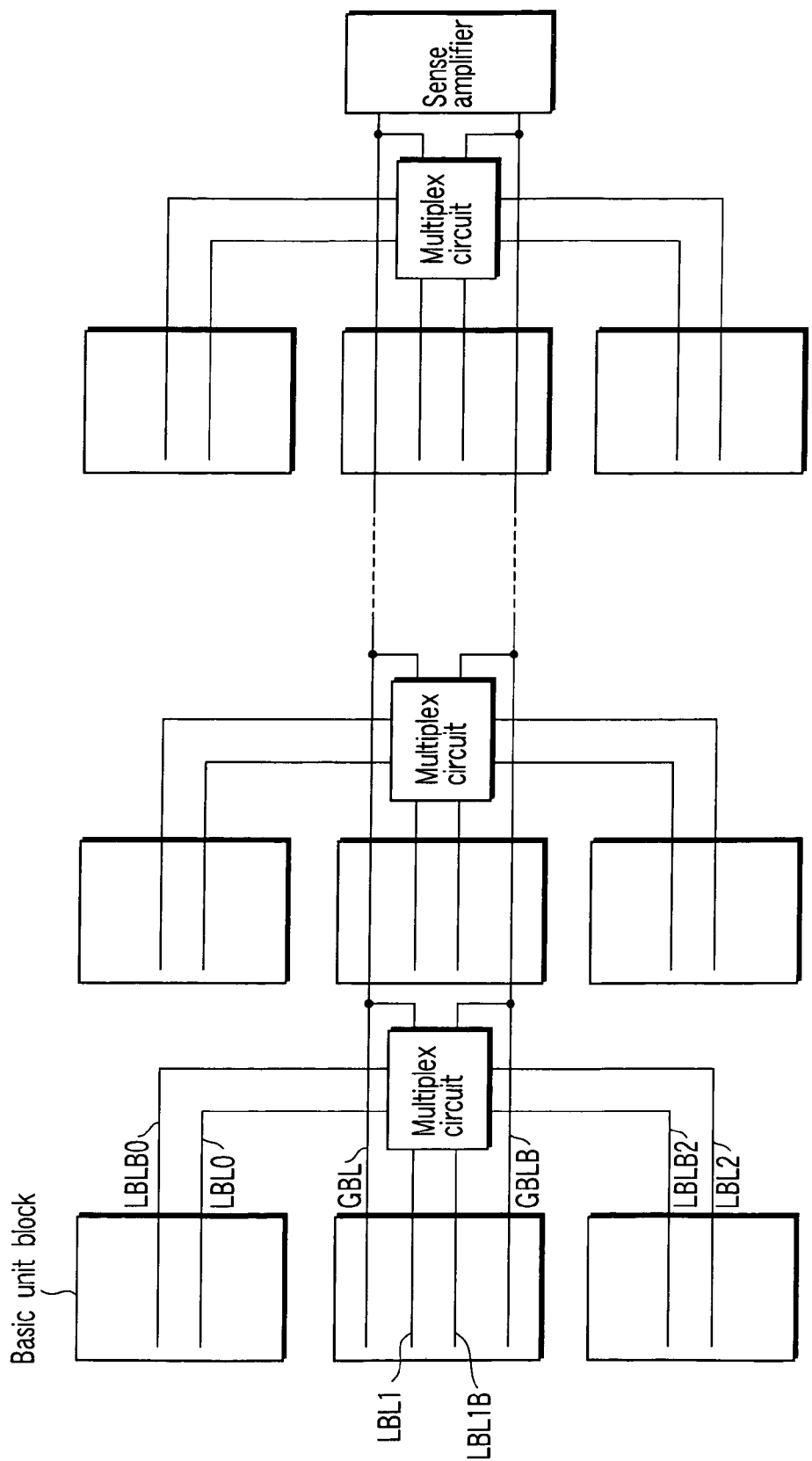
F I G. 3

SEMICONDUCTOR MEMORY DEVICE HAVING LAYERED BIT LINE STRUCTURE

CROSS-REFERENCE TO RELATED APPLICATIONS

This application is based upon and claims the benefit of priority from prior Japanese Patent Application No. 2005-241259, filed Aug. 23, 2005, the entire contents of which are incorporated herein by reference.

BACKGROUND OF THE INVENTION

1. Field of the Invention

The present invention relates to a semiconductor memory device having a layered bit line structure, and in particular, to a layered bit line structure which uses a twist structure and which is used in, for example, static semiconductor memories.

2. Description of the Related Art

The capacity ratio of bit line to a memory cell is an important parameter for read circuits for semiconductor memory devices. The capacity of the bit lines depends on the structure of memory cells, a material for the bit lines, process parameters, and the number of memory cells connected to one bit line. The reduced size of elements reduces the bit line capacitance per memory capacity bit, enabling an increase in the number of memory cells connected to one bit line. However, an increase in the number of memory cells cannot be simply achieved but must be traded off with a decrease in memory capacity, an increase in noise amount, and the like. On the other hand, cell current has been decreasing consistently with cell size, whereas a higher performance, particularly an increased read speed has been requested. The amount of time from a rise in word line voltage until sense start depends on cell current magnitude, bit line capacitance, and bit line resistance. With no measures taken, the required performance cannot be achieved since the decrease amount of capacity of the bit lines themselves is much smaller than the decrease amount of cell current.

In a memory cell circuit adopting a differential reading scheme of increasing the number of pieces into which a bit line is divided and using a differential sense amplifier to sense and amplify a micro-potential, the cell current is generally small and the above phenomenon is thus marked.

With the cell current reduced, the ability to similarly reduce bit line capacitance and resistance enables the same operation speed as that at a larger cell current to be achieved. In this case, an increase in chip size can be prevented by employing a layered bit line structure to reduce the bit line capacitance and resistance, while preventing an increase in the numbers of sense amplifiers and column decoders. The layered bit line structure is composed of a global bit line pair and a plurality of local bit line pairs. A plurality of basic cell blocks are connected to the global bit line pair. A set of local bit line pairs is connected to each basic cell block. A plurality of memory cells are provided in each basic cell block. A plurality of word lines select one of the plurality of memory cells in each basic cell block. The data in the selected memory cell is read to the corresponding local bit line pair. Moreover, one of the plurality of local bit line pairs is selected and connected to the global bit line pair.

Coupling capacitances are present between the global bit line pair and the plurality of local bit lines. Consequently, the local bit line pair connected to the global bit line pair for data sensing is affected by the remaining local bit line pairs which are not subjected to data sensing. This results in noise in the local bit line pair that is subjected to data sensing. The noise reduces the potential difference between the paired local bit lines that are subjected to data sensing. In this case, since the time to start a sense timing is predetermined, sense margin decreases to prevent correct data from being read.

Jpn. Pat. Appln. KOKAI Publication Nos. 2002-100187 and 8-236714, U.S. Pat. No. 5,815,428, and the like disclose a bit line one-side reading scheme that allows a larger cell current to flow. This scheme adopts a layered bit line structure and a structure in which one of the paired global bit lines also serves as a local bit line. In this case, the global and local bit lines cross each other (the lines are twisted).

BRIEF SUMMARY OF THE INVENTION

An aspect of the present invention provides a semiconductor memory device comprising a basic unit block column comprising a plurality of basic unit blocks each including a plurality of memory cells, a common first bit line pair connected to the plurality of memory cells, a bit line precharge circuit coupled to the first bit line pair, and a pair of transfer gate switch circuits connected to the first bit line pair, a second bit line pair connected to the plurality of basic unit blocks via the pair of transfer gate switch circuits in the plurality of basic unit blocks, the second bit line pair being formed of a wiring layer located above the first bit line pair and constituting a layered bit line structure together with the first bit line pair, the second bit line pair being laid out to extend in the same direction as that of the first bit line pair, the second bit line pair being twisted once or more in the extending direction of the second bit line pair, and a first differential sense amplifier coupled to the second bit line pair to sense and amplify a potential difference between the paired second bit lines.

BRIEF DESCRIPTION OF THE SEVERAL VIEWS OF THE DRAWING

FIG. 1 is a circuit diagram of a semiconductor memory device of a first embodiment;

FIG. 3 is a block diagram of a semiconductor memory device in a comparative example;

DETAILED DESCRIPTION OF THE INVENTION

Figure 2:
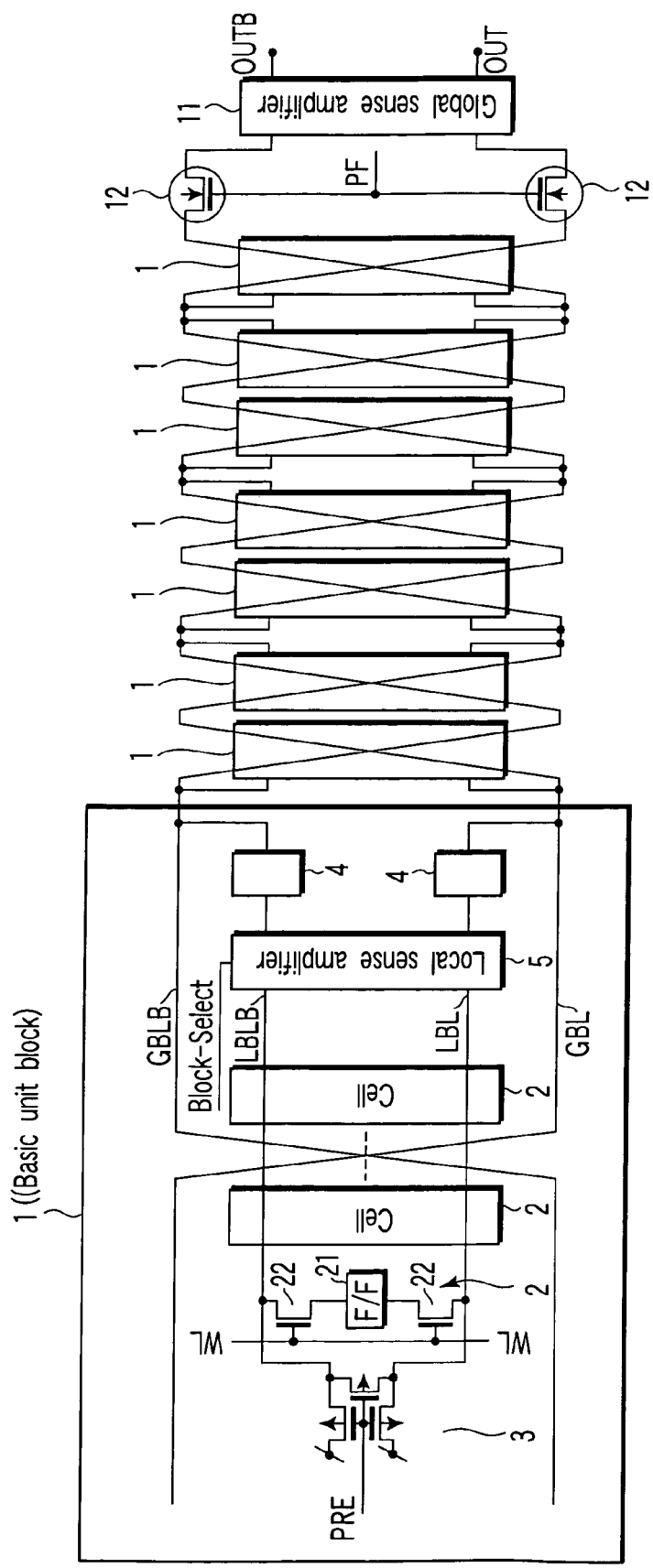
FIG. 2 is a circuit diagram of a semiconductor memory device of a second embodiment.

Embodiments of the present invention will be described with reference to the drawings. In the description, components common to all the drawings are denoted by common reference numerals.

First Embodiment

FIG. 1 is a circuit diagram of a part of a memory circuit in a semiconductor memory device of a first embodiment. The semiconductor memory device of the first embodiment adopts a layered bit line structure and a differential reading scheme. In FIG. 1, reference numeral 1 denotes a basic unit block, and reference numeral 10 denotes a basic unit block column consisting of a plurality of basic unit blocks. Reference characters GBL and GBLB denote a common global bit line pair provided for the basic unit block column 10. Reference numeral 11 denotes a differential sense amplifier that senses and amplifies the potential difference between the paired global bit lines GBL and GBLB.

Each basic unit block 1 is provided with a plurality of, for example, 512 memory cells 2. A common set of local bit lines LBL and LBLB is connected to the plurality of memory cells 2. A bit line precharge circuit 3 is connected to the local bit line pair LBL, LBLB. A pair of transfer gate switch circuits 4, 4 is connected to the local bit line pair LBL, LBLB.

In the present example, the memory cell 2 is a general static memory (SRAM) of a 6 transistor type which consists of a CMOS type flip flop (F/F) 21 having a pair of I/O nodes to store 1-bit data, and a pair of transfer gate transistors 22, 22. Both gate electrodes of a pair of transfer data transistors 22, 22 are connected to one word line WL. However, the memory cell 2 is not limited to this but has only to have at least one pair of read nodes or I/O nodes. The precharge circuit 3 is composed of, for example, three PMOS transistors. Each of the paired switch circuits 4, 4 is composed of a transfer gate in which an NMOS and PMOS transistors are connected in parallel.

The global bit line pair GBL, GBLB is composed of a wiring layer located above the local bit line pair LBL and LBLB, provided in each basic unit block 1. The global bit line pair GBL, GBLB and the plurality of local bit line pairs LBL, LBLB constitute a layered bit line structure. The global bit line pair GBL, GBLB and the plurality of local bit line pairs LBL, LBLB are laid out to extend in the same direction. The global bit line pair GBL, GBLB is connected to the differential sense amplifier 11 via switch elements 12, 12. In the present example, the paired global bit lines GBL and GBLB cross each other once in the center of each basic unit block 1. Each of the switch elements 12, 12 is composed of, for example, an NMOS transistor and is controllably turned on and off on the basis of an output signal PF from a column decoder. FIG. 1 shows that eight basic unit blocks 1 are provided in the basic unit block column 10. However, it is possible to arbitrarily vary the number of basic unit blocks 1 in the basic unit block column 10 and the number of memory cells provided in the basic unit block 1, according to a required performance.

The semiconductor memory device of the first embodiment comprises a memory circuit in which the differential sense amplifier 11 senses and amplifies the potential difference between the global bit line pair GBL, GBLB provided in association with the basic unit block column 10. Each of the basic unit blocks 1 in the basic unit block column 10 has a plurality of memory cells 2, the common local bit line pair LBL, LBLB connected to the plurality of memory cells 2, the bit line precharge circuit 3 connected to each local bit line pair LBL, LBLB, and the pair of switch circuits 4, 4 connected to each local bit line pair LBL, LBLB. Each local bit line pair LBL, LBLB is connected to the global bit line pair GBL, GBLB via the pair of switch circuits 4, 4. The global bit line pair GBL, GBLB is connected to the differential sense amplifier 11 via the switch elements 12, 12. The global bit line pair GBL, GBLB is composed of a wiring layer located above the local bit line pair LBL and LBLB. The global bit line pair GBL, GBL and the plurality of local bit line pairs LBL, LBLB constitute a layered bit line structure. The global bit line pair GBL, GBL and the plurality of local bit line pairs LBL, LBLB are laid out to extend in the same direction. The paired global bit lines GBL and GBLB cross each other once or more.

When the paired global bit lines GBL and GBLB thus cross each other once or more in the basic unit block, the coupling capacitances between the global and local bit lines GBL and LBL and between the global and local bit lines GBLB and LBL are reduced to half compared to those achieved without the crossing.

It is assumed that one of the word lines WL in each of the eight basic unit blocks 1 is selected (a total of eight word lines are selected) and that data "0" read from the leftmost block in the figure is transferred to the global bit line GBL. In this case, if data "1" are read from the remaining seven blocks, noise occurs to pull the global bit line GBLB down to "L". However, since the paired global bit lines GBL and GBLB cross each other in the basic unit block 1, this noise can be cancelled to enable the correct data to be read. This makes it possible to improve margins.

The crossing of the paired global bit lines GBL and GBLB requires an extra space, but if possible, may be carried out in the area between the basic unit blocks 1 or on a cell array. For example, the global bit lines GBL and GBLB are allowed to cross each other in the center of the block (half of the plurality of memory cells are located on both sides of this position). If the global bit lines cross each other once in each basic unit block 1, a massive memory can be designed by repeatedly arranging the basic unit blocks 1 as macro-cells.

Second Embodiment

FIG. 2 shows a circuit diagram showing a part of a memory circuit in a semiconductor memory device of a second embodiment. The memory circuit shown in FIG. 2 has the same configuration as that of the memory circuit described above with reference to FIG. 1 except that in each basic unit block 1, the local bit line pair LBL, LBLB is connected to the global bit line pair GBL, GBLB via a local sense amplifier 5.

The local sense amplifier 5 connected to a part of the local bit line pair LBL, LBLB which is closer to the memory cells than the switch circuits 4, 4. The local sense amplifier 5 is driven in response to a block-select signal. The local sense amplifier 5 senses and amplifies the potential difference between the paired local bit lines LBL and LBLB and transfers it to the global bit line pair GBL, GBLB. The local sense amplifier 5 provided in each basic unit block 1 enables read data in each basic unit block to be more reliably sensed and amplified.

Third Embodiment

Now, description will be given of a memory device in a semiconductor memory device employing an n:1 bit line structure and a differential reading scheme. FIG. 3 shows the block configuration of a memory circuit in a comparative example. In this case, data in three local bit line pairs LBL0, LBL0B, LBL1, LBL1B, LBL2, and LBL2B is transferred to the global bit line pair GBL, GBLB. It is assumed that in each of three block columns, one of the word lines WL in each of the eight basic unit blocks 1 is selected (a total of eight word lines are selected) and that data "1" is written to the local bit line LBL0, while data is read from the local bit lines LBL1 and LBL2. If the write data "1" is transferred to the global bit line GBL, the potential of the local bit line pair LBL1, LBL1B is affected by the coupling capacitance between the global bit line GBL and the local bit line LBL1 and the coupling capacitance between the global bit line GBLB and the local bit line LBL1B. This may disadvantageously prevent the correct data from being restored in the memory cell connected to the local bit line pair.

Figure 4:
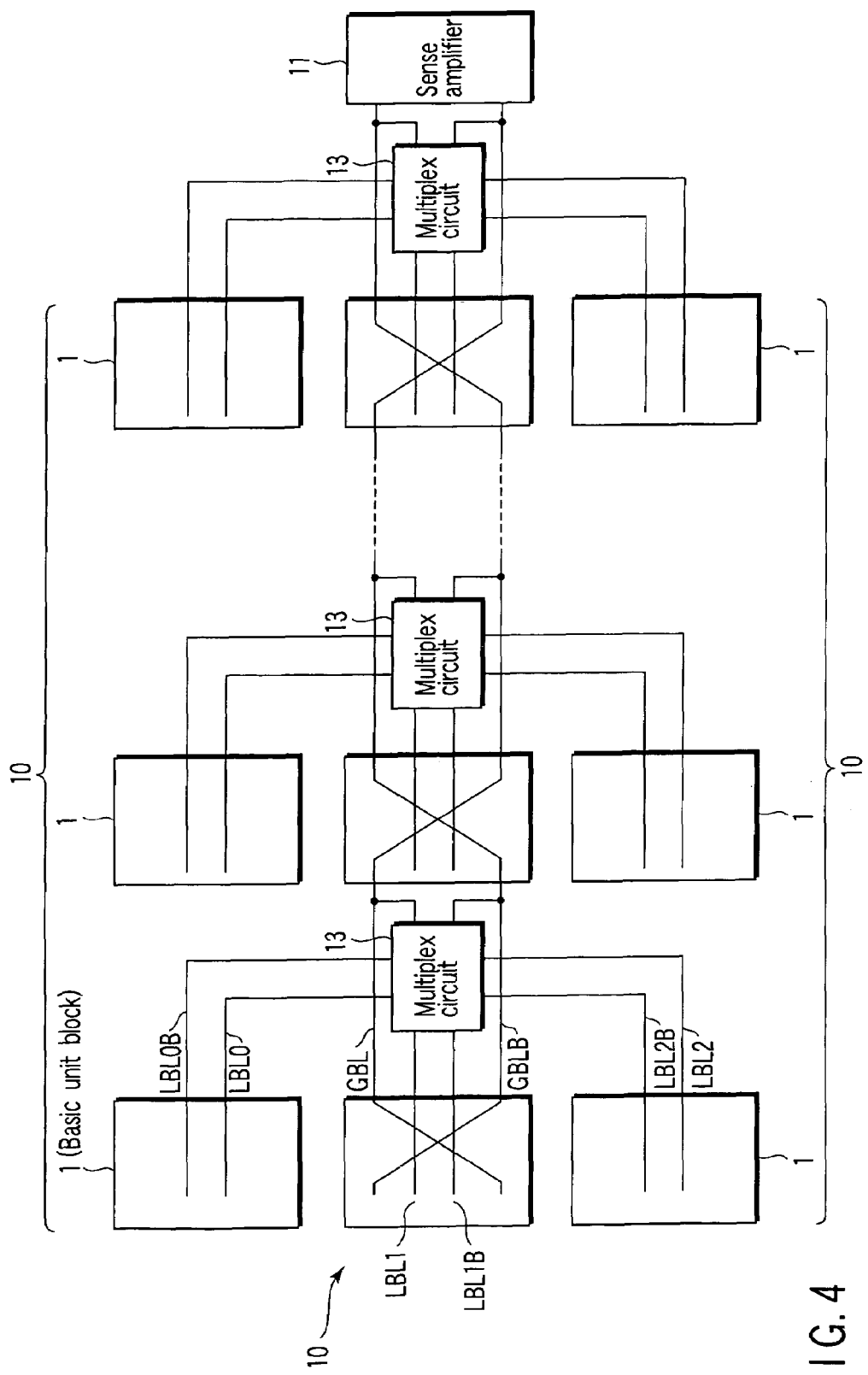
FIG. 4 is a block diagram of a semiconductor memory device of a third embodiment.

FIG. 4 is a block diagram of a part of a memory circuit in a semiconductor memory device of a third embodiment. This memory circuit adopts a layered bit line structure in which the ratio of local bit lines to global bit lines is n:1, as well as a differential reading scheme.

The memory circuit shown in FIG. 4 has the same configuration as that of the memory circuit described above with reference to FIG. 1 except that one global bit line pair GBL, GBLB is provided for n (plural) basic unit block columns 10 and that a multiplex circuit 13 is provided to connect the global bit line pair GBL, GBLB to the local bit line pair LBL, LBLB in one basic unit block 1 selected from the basic unit blocks 1 in one basic unit block column 10 selected from the n basic unit block columns 10. The multiplex circuit 13 is selectively controlled via a column address.

Specifically, the basic unit blocks 1 are provided in an m×n (m and n are positive integers) matrix. Each basic unit block 1 includes a plurality of memory cells 2, the common local bit line pair LBL, LBLB (LBL0, LBL0B, LBL1, LBL1B, LBL2, LBL2B) connected to the plurality of memory cells 2, and a precharge circuit 3 connected to the local bit line pair LBL, LBLB. The common global bit line pair GBL, GBLB is provided for the plurality of, (m×n), basic unit blocks 1 and is formed of a wiring layer located above the local bit line pair LBL, LBLB. The global bit line pair GBL, GBLB and the local bit line pair LBL, LBLB constitute a layered bit line structure. The global bit line pair GBL, GBLB is twisted once or more. One multiplex circuit 13 is provided for n (in the present example, three) basic unit blocks which are provided in each row of the plurality of, (m×n), basic unit blocks 1. Each multiplex circuit 13 selects and connects one of the local bit line pairs LBL0, LBL0B, LBL1, LBL1B, LBL2, LBL2B in the three basic unit blocks to the global bit line pair GBL, GBLB.

The memory circuit in FIG. 4 is based on a three-to-one multiplex scheme in which three basic unit columns 10 share one sense amplifier (global sense amplifier) 11. In this example, the first embodiment described above with reference to FIG. 1 is applied only to one basic unit block column 10 along which the global bit line pair GBL, GBLB is extended. In the present example, the global bit line pair GBL, GBLB is extended along, for example, the central one of the three basic unit blocks 10. The multiplex circuit 13 selects and connects one of the three local bit line pairs LBL0, LBL0B, LBL1, LBL1B, LBL2, LBL2B to the global bit line pair GBL, GBLB.

In the semiconductor memory device of the third embodiment, the multiplex circuit 13 selectively connects the local bit line pairs LBL0, LBL0B, LBL1, LBL1B, LBL2, LBL2B to the global bit line pair GBL, GBLB. The differential sense amplifier 11 is connected to the global bit line pair GBLL GBLB. The local bit line pairs LBL0, LBL0B, LBL1, LBL1B, LBL2, LBL2B and the global bit line pair GBL, GBLB are laid out to extend in the same direction. The global bit line pair GBL, GBLB is formed of a wiring layer located above the local bit line pairs LBL0, LBL0B, LBL1, LBL1B, LBL2, LBL2B. The global bit line pair GBL, GBLB and local bit line pairs LBL0, LBL0B, LBL1, LBL1B, LBL2, LBL2B constitute a layered bit line structure in which the ratio of the local bit line pairs LBL0, LBL0B, LBL1, LBL1B, LBL2, LBL2B to the global bit line pair GBL, GBLB is 3:1. The paired global bit lines GBL and GBLB cross each other once or more.

In this configuration, it is assumed that write data "1" is transferred to the global bit line GBL and that one of the word lines in each of eight basic unit blocks is selected (a total of eight words lines are selected). It is further assumed that data "1" is transferred to the local bit line LBL0 in one basic unit block column and-that "data "0" is read from the local bit lines LBL1 and LBL2 in the basic unit block columns. In this case, in each basic unit block, the adverse effect of write noise is reduced to 1/(number of crossings of the paired global bit lines); the adverse effect of write noise results from the coupling capacitance between the global bit line GBL and the local bit line LBL1 and the coupling capacitance between the global bit line GBLB and the local bit line LBL1B. This allows the correct data to be written to (restored in) the memory cell connected to the local bit line pair LBL1, LBL1B.

First Variation of the Third Embodiment

FIG. 4 illustrates that the global bit lines GBL and GBLB cross each other in each block in the basic unit block column and plural times (eight times) in total. However, in a variation of the third embodiment, the global bit lines GBL and GBLB may cross each other at least once on in the basic unit block column. However, in this case, the above noise reducing effect decreases.

Second Variation of the Third Embodiment

In FIG. 4, the global bit line pair GBL, GBLB is extended on the central basic unit block column. However, the global bit line pair GBL, GBLB may be distributed to the basic unit block columns at the opposite ends so that one GBL of the global bit lines is located on the basic unit block column at one end, while the other global bit line GBLB is located on the basic unit block column at the other end.

Fourth Embodiment

Figure 5:
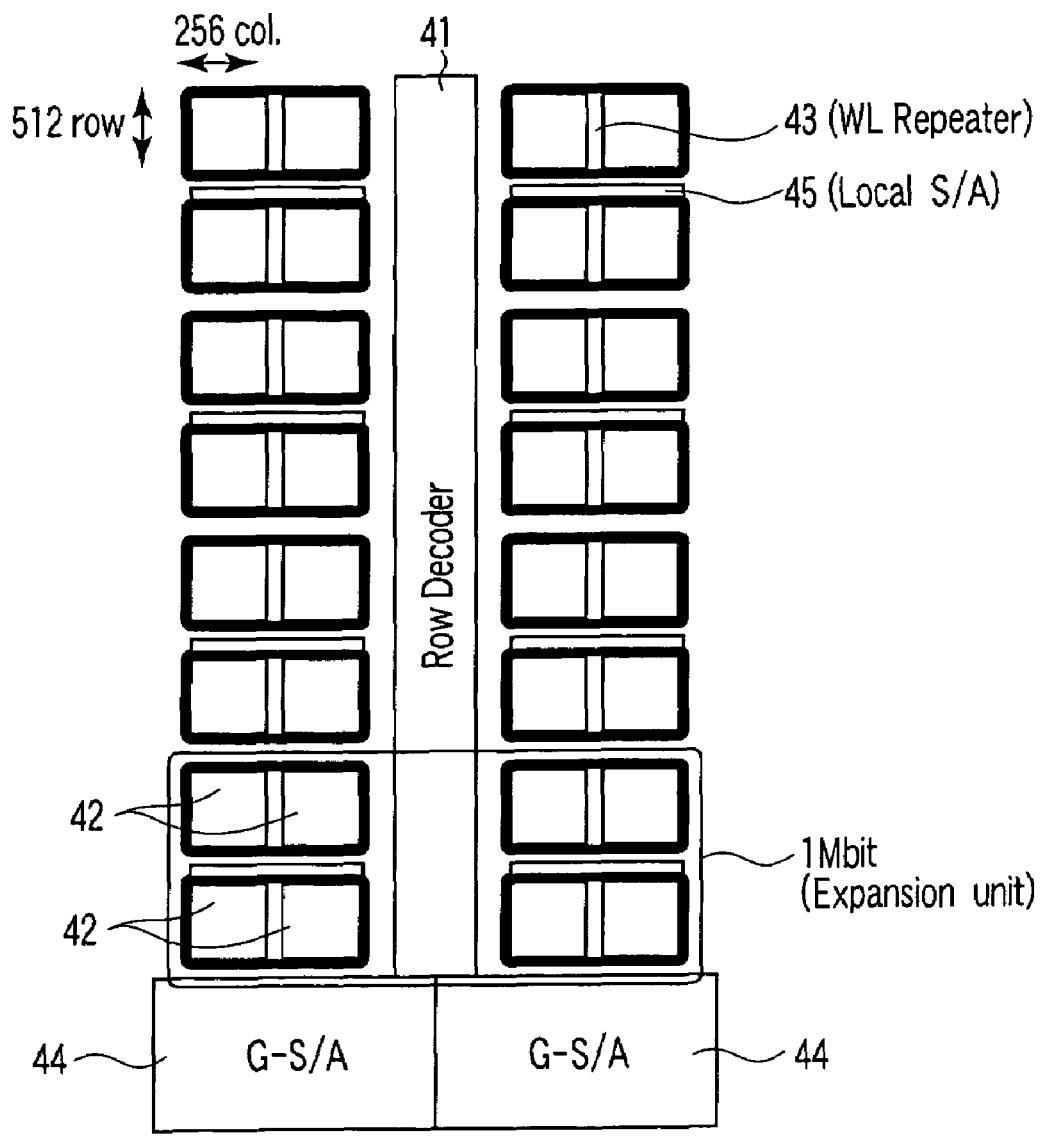
FIG. 5 is a block diagram of a semiconductor memory device of a fourth embodiment.

FIG. 5 shows the exemplary layout of a memory circuit in a semiconductor memory device of a fourth embodiment. A plurality of sub-cell arrays 42 are arranged in a 2×8 matrix on the left side of a row decoder 41. A word line repeater (WL repeater) circuit 43 is placed between the two sub-cell arrays. A global sense amplifier (G-S/A) 44 is placed at one end of the two sub-cell arrays. As described above, a plurality of sub-cell arrays 42 are also arranged in a 2×8 matrix on the right side of the row decoder 41. The word line repeater (WL repeater) circuit 43 is placed between the two sub-cell arrays. The global sense amplifier (G-S/A) 44 is placed at one end of the two sub-cell arrays.

Each sub-cell array 42 consists of, for example, 512×256 memory cells; 4×8 sub-cell arrays 42 have 4,096×1,024 memory cells. In this case, a total of the eight sub-cell arrays 42 on the right and left side of the row decoder 41 form a unit block of capacity 1 Mbits. In this example, a 4-Mbit capacity is formed by adding a corresponding number of unit blocks.

In the 1-Mbit unit block, a local sense amplifier 45 is placed between the two sub-cell arrays. Therefore, in the present embodiment, 1,024 columns of circuits are provided which are configured as described above for the second embodiment with reference to FIG. 2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a basic unit block column having a plurality of basic unit blocks each having a plurality of memory cells, a first bit line pair connected to the plurality of memory cells, a bit line precharge circuit connected to the first bit line pair, and a pair of transfer gate switch circuits connected to the first bit line pair, each of the plurality of basic unit blocks further includes a first differential sense amplifier connected between the first bit line pair and the pair of transfer gate switch circuits to sense and amplify a potential difference between the first bit line pair;
a second bit line pair connected to the plurality of basic unit blocks via the pair of transfer gate switch circuits in the plurality of basic unit blocks, the second bit line pair being formed of a wiring layer located above the first bit line pair and constituting a layered bit line structure together with the first bit line pair, the second bit line pair being laid out to extend in the same direction as that of the first bit line pair, the second bit line pair being twisted once or more in the extending direction of the second bit line pair; and
a second differential sense amplifier coupled to the second bit line pair to sense and amplify a potential difference between the second bit line pair.

2. A semiconductor memory device according to claim 1, wherein the second bit line pair is twisted once in each of the plurality of basic unit blocks.

3. A semiconductor memory device according to claim 2, wherein the second bit line pair is twisted in a center of each of the plurality of basic unit blocks.

4. A semiconductor memory device according to claim 1, further comprising a pair of second switch elements connected between the second bit line pair and the first sense amplifier.

5. A semiconductor memory device comprising:
a basic unit block column having a plurality of basic unit blocks each having a plurality of memory cells, a first bit line pair connected to the plurality of memory cells, a bit line precharge circuit connected to the first bit line pair, and a pair of transfer gate switch circuits connected to the first bit line pair, each of the plurality of memory cells includes a memory circuit which has a pair of I/O nodes and which stores 1-bit data and a pair of first switch elements connected between the pair of I/O nodes of the memory circuit and the first bit line pair;
a second bit line pair connected to the plurality of basic unit blocks via the pair of transfer gate switch circuits in the plurality of basic unit blocks, the second bit line pair being formed of a wiring layer located above the first bit line pair and constituting a layered bit line structure together with the first bit line pair, the second bit line pair being laid out to extend in the same direction as that of the first bit line pair, the second bit line pair being twisted once or more in the extending direction of the second bit line pair; and
a first differential sense amplifier coupled to the second bit line pair to sense and amplify a potential difference between the second bit line pair.

6. A semiconductor memory device according to claim 5, wherein the second bit pair line is twisted once in each of the plurality of basic unit blocks.

7. A semiconductor memory device according to claim 6, wherein the second bit line pair is twisted in a center of each of the plurality of basic unit blocks.

8. A semiconductor memory device according to claim 5, further comprising:
a pair of second switch elements connected between the second bit line pair and the first sense amplifier.

9. A semiconductor memory device comprising:
a plurality of basic unit blocks in an m×n (m and n are positive integers) matrix each including a plurality of memory cells, a first bit line pair connected to the plurality of memory cells, a bit line precharge circuit coupled to the first bit line pair, and a pair of transfer gate switch circuits connected to the first bit line pair;
a second bit line pair provided for the plurality of basic unit blocks, the second bit line pair being formed of a wiring layer located above the first bit line pair and constituting a layered bit line structure together with the first bit line pair, the second bit line pair being twisted once or more; and
m multiplex circuits each provided for every n basic unit blocks which are arranged in each row of the plurality of basic unit blocks, each of the multiplex circuits selecting and connecting one of the first bit line pairs in the n basic unit blocks to the second bit line pair; and
a differential sense amplifier connected to the second bit line pair to sense and amplify a potential difference between the second bit line pair.

10. A semiconductor memory device according to claim 9, wherein the second bit line pair is extended on the basic unit blocks in one of the n columns of basic unit blocks.

11. A semiconductor memory device according to claim 10, wherein the second bit line pair is twisted once in each of the plurality of basic unit blocks.

12. A semiconductor memory device according to claim 11, wherein the second bit line pair is twisted in a center of each of the plurality of basic unit blocks.

13. A semiconductor memory device according to claim 9, wherein each of the plurality of memory cells includes a memory circuit which has a pair of I/O nodes and which stores 1-bit data and a pair of first switch elements connected between the pair of I/O nodes of the memory circuit and the first bit line pair.

* * * * *